(12) United States Patent
Sobue

(10) Patent No.: US 7,262,649 B2
(45) Date of Patent: Aug. 28, 2007

(54) HYSTERESIS COMPARATOR

(75) Inventor: Satoshi Sobue, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 11 days.

(21) Appl. No.: 11/358,048

(22) Filed: Feb. 22, 2006

(65) Prior Publication Data

US 2006/0214720 A1 Sep. 28, 2006

(30) Foreign Application Priority Data

Mar. 23, 2005 (JP) ............................ 2005-084057

(51) Int. Cl.
*H03K 3/00* (2006.01)
(52) U.S. Cl. ....................... 327/205; 327/206
(58) Field of Classification Search ................ 327/205, 327/206
See application file for complete search history.

(56) References Cited

U.S. PATENT DOCUMENTS 4,384,219 A * 5/1983 Davis .......................... 327/80

FOREIGN PATENT DOCUMENTS

JP A-2003-179469 6/2003
JP A-2004-304515 10/2004

* cited by examiner

*Primary Examiner*—Kenneth B. Wells
(74) *Attorney, Agent, or Firm*—Posz Law Group, PLC

(57) ABSTRACT

A comparator includes a differential amplification circuit having differential input transistors and load transistors, an output transistor for outputting an output value of the comparator, a diode having a cathode connected to a ground, a current output circuit, a resistor connected between an anode of the diode and the bases of the load transistors. When the output transistor is in the OFF state, the diode clamps the voltage of the resistor to a forward voltage so that no current flows through the resistor. When the output transistor is in the ON state, the resistor has a slight voltage so that a slight current flows through the resistor. Thus, a threshold voltage of the comparator has a slight hysteresis without increase in resistance of the resistor.

5 Claims, 4 Drawing Sheets

Ia=3μA, Ta=27°C

| CASE | R11 | R12 | R2 | R13 | VTH | VTL | VHIS |
|------|------|------|------|-------|---------|---------|---------|
| 1 | 100kΩ | 300kΩ | 100kΩ | 2000kΩ | 4.1016V | 4.1003V | 0.0013V |
| 2 | 100kΩ | 300kΩ | 100kΩ | 1000kΩ | 4.1029V | 4.1004V | 0.0025V |
| 3 | 200kΩ | 300kΩ | 100kΩ | 1000kΩ | 4.1007V | 4.1003V | 0.0004V |
| 4 | 200kΩ | 200kΩ | 100kΩ | 1000kΩ | 4.1006V | 4.1002V | 0.0004V |
| 5 | 200kΩ | 200kΩ | 100kΩ | 500kΩ | 4.1012V | 4.1002V | 0.0010V |

HYSTERESIS COMPARATOR

CROSS REFERENCE TO RELATED APPLICATION

This application is based on and incorporates herein by reference Japanese Patent Application No. 2005-84057 filed on Mar. 23, 2005.

FIELD OF THE INVENTION

The present invention relates to a comparator having a hysteresis characteristic.

BACKGROUND OF THE INVENTION

A comparator disclosed in JP-A-2004-304515 has an impedance-converting transistor (level-shift transistor) connected to a differential input transistor. In this comparator, the amount of a current flowing through the impedance converter transistor is changed between when an input voltage increases and when the input voltage decreases. Thus, an offset voltage (hysteresis voltage) is provided.

A comparator disclosed in JP-A-2003-179469 has also a level shift transistor. The comparator uses relationship between a collector current and a base-emitter voltage of a bipolar transistor to produce a slight hysteresis voltage. In this comparator, a bias current of the level-shift transistor is changed in accordance with an output of an input differential circuit.

FIGS. 5A and 5B show a circuit diagram of a well-known comparator 1 having a hysteresis characteristic. The comparator 1 includes a differential amplification circuit 5 having transistors Q1-Q4 and a constant current circuit 4, a constant current circuit 6 for outputting a constant current Ia, a transistor Q5, and a resistor R1. The comparator 1 is connected to an output circuit 8 having a resistor R2, a constant current circuit 7, and a transistor Q6. The bases of the transisitor Q1 and the transistor Q2 are used as an inverting input terminal and a non-inverting input terminal of the comparator 1, respectively.

FIG. 6 shows a first threshold voltage VTL and a second threshold voltage VTH of the comparator 1 when a reference voltage Vref is applied to the inverting input terminal of the comparator 1.

When the voltage of the non-inverting input terminal becomes higher than the second threshold voltage VTH, the transistor Q5 is turned off and the transistor Q6 is turned on, as shown in FIG. 5A. An electric current I1 flows from the constant current circuit 6 to the bases of the transistors Q3, Q4 through the resistor R1. The current I1 is given by the following equation:

$$I1 = \frac{R2}{R1+R2} \times Ia$$

The current I1 changes the threshold voltage of the comparator 1 from the second threshold voltage VTH to the first threshold voltage VTL lower than the reference voltage Vref.

In contrast, when the voltage of the non-inverting input terminal becomes lower than the first threshold voltage VTL, the transistor Q5 is turned on and the transistor Q6 is turned off, as shown in FIG. 5B. An electric current I2 flows from the bases of the transistors Q3, Q4 to the transistor Q5 through the resistor R1. The current I2 is given by the following equation:

$$I2 = \frac{VF - VCEsat(Q5)}{R1}$$

The VF is a P-N junction forward voltage of the transistor Q5. The VCEsat (Q5) is a collector-emitter saturation voltage of the transistor Q5.

The current I2 changes the threshold voltage of the comparator 1 from the first threshold voltage VTL to the second threshold voltage VTH higher than the reference voltage Vref.

Thus, the comparator 1 has a hysteresis voltage VHIS (=VTH−VTL).

For example, the comparator 1 has the hysteresis voltage VHIS of 4.4 millivolts (mV), when the resistor R1 is set to 2 megaohms (MΩ), the constant current Ia is set to 3 microamperes (µA), and temperature is set to 27° C.

When the comparator 1 has a slighter hysteresis voltage VHIS, the current I1, I2 need to be reduced. Therefore, there arises a need to increase size of the resistor such as the resistor R1 in order to increase resistance of the resistor.

In general, the resistor has a chip size of 0.024 mm² per 1 MΩ. In contrast, a pad of an IC chip of the comparator 1 has a size of 0.01 mm². Therefore, if the resistance of the resistor is increased, the IC chip size of the comparator 1 is significantly increased so that manufacturing cost of the comparator 1 is increased.

SUMMARY OF THE INVENTION

In view of the above-described problem, it is an object of the present invention to provide a comparator having a hysteresis characteristic of a slight hysteresis voltage without increase in chip size.

A comparator having a slight hysteresis voltage includes a differential amplification circuit having differential input transistors and load transistors having bases coupled to each other, an output transistor, a diode having a cathode connected to a ground line, a current output circuit, a first resistor connected between the current output circuit and the output transistor, a second resistor connected between the current output circuit and an anode of the diode, and a third resistor connected between the anode of the diode and the bases of the load transistors.

The comparator has a first threshold voltage and a second threshold voltage when a reference voltage is applied to one of the differential input transistors of the differential amplification circuit.

The differential amplification circuit outputs a voltage in accordance with voltage inputted to the differential input transistors. The output transistor is turned on and off in accordance with the output voltage of the differential amplification circuit.

When the output transistor is in the OFF state, an electric current flows from the current output circuit to a ground line through the second resistor and the diode. In this case, a forward voltage of the diode is applied to both the anode of the diode and the bases of the load transistors with reference to the ground line. As a result, both ends of the third resistor are held at the same voltage so that no current flows through the third resistor. Therefore, the first threshold voltage becomes equal to the reference voltage.

When an input voltage applied to the other of the differential input transistors rises above or falls below the first threshold voltage, the output transistor changes from the OFF state to ON state (saturated state).

When the output transistor is in the ON state, an electric current flows from the current output circuit to the ground line through the first resistor and the output transistor. Further, an electric current flows from the bases of the load transistors to the ground line through the third resistor, the second resistor, the first resistor, and the output transistor. Then, voltage potential of the third resistor is reduced at one end connected to the diode due to voltage drop of the third resistor. As a result, voltage applied to the diode becomes lower than the forward voltage so that the diode is turned off.

At the same time, the voltage potential of the third resistor is increased at the end due to voltage drop of the first resistor. Thus, the voltage applied to the third resistor is reduced so that the current flowing through the third resistor is reduced. Therefore, even when the third resistor has a relatively low resistance, i.e., a relatively small size, the second threshold voltage can be close to the reference voltage.

Thus, the comparator can have the slight hysteresis voltage without increase in its chip size.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
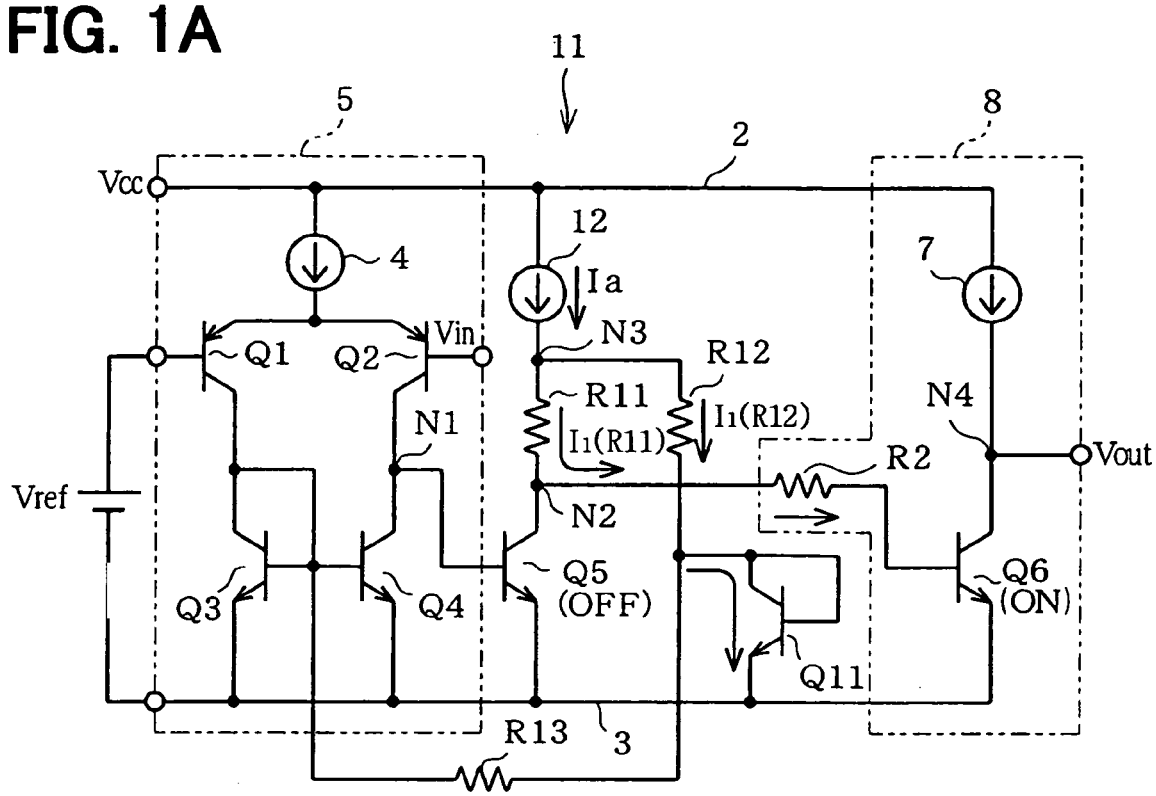
FIG. 1A and FIG. 1B are circuit diagrams of a comparator according to a first embodiment of the present invention.
Figure 1B:
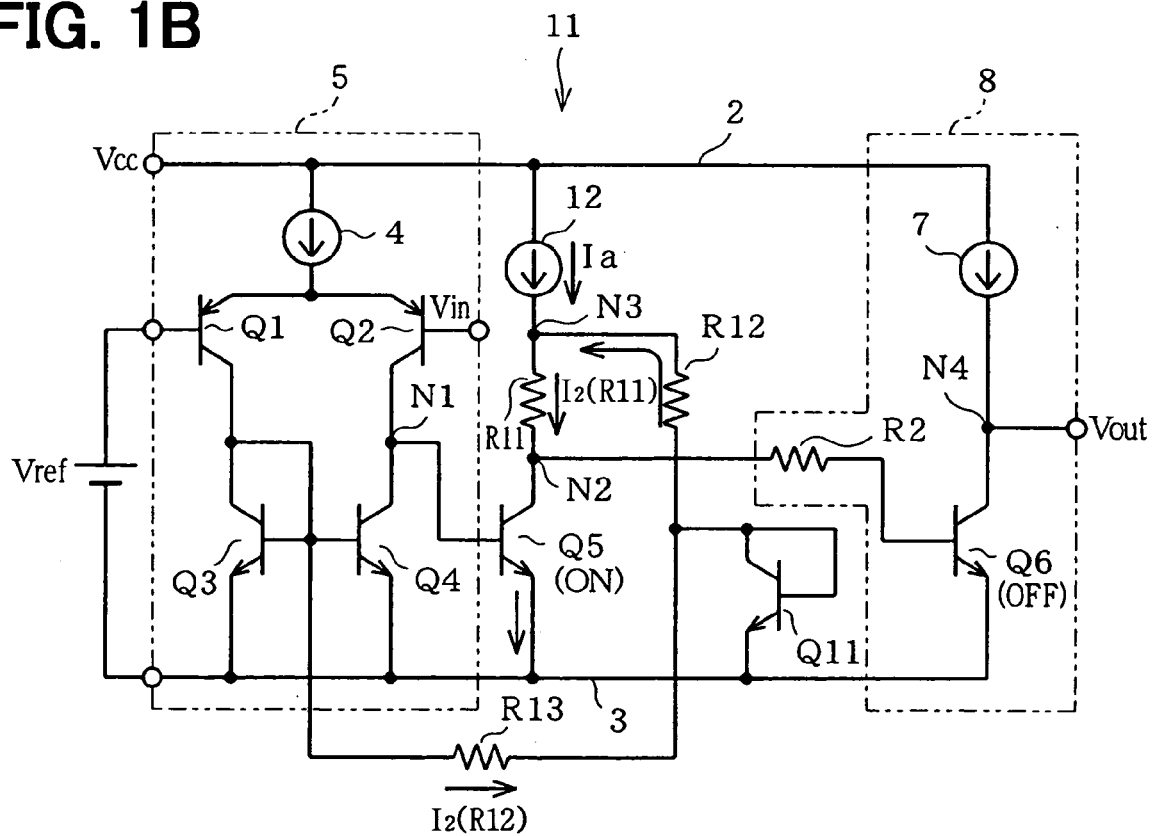

Reference is made to FIG. 1A and FIG. 1B, which show a comparator 11 connected to an output circuit 8. The comparator 11 and the output circuit 8 are integrated to each other and provided as a semiconductor integrated circuit (IC) device. The IC device has a pair of power lines 2, 3 through which a power voltage Vcc is supplied to the IC device. The power line 3 has a potential lower than the power line 2.

A differential amplification circuit 5 includes a pair of p-channel transistors (differential input transistors) Q1, Q2, a constant current circuit 4 connected to the emitters of the transistors Q1, Q2, and a pair of n-channel transistors (load transistors) Q3, Q4 connected between the collectors of the transistors Q1, Q2 and the power line 3. The transistors Q3, Q4 have the bases coupled to each other and act as active load.

The differential amplification circuit 5 has an output node N1 connected to the base of an n-channel transisitor (output transistor) Q5. The comparator 11 has an output node N2 connected to the collector of the transistor Q5. The emitter of the transistor 5 is connected to the power line 3.

A constant current circuit (current output circuit) 12 and a resistor (first resistor) R11 are connected in series to each other between the power line 2 and the collector of the transistor Q5.

The transistor Q11 has the base and the collector coupled to the base. Thus, the transistor Q11 acts as a diode. In this case, the base and the collector of the transistor Q11 correspond the anode of the diode, and the emitter of the transistor Q11 corresponds the cathode of the diode.

The anode of the diode is connected to a node N3 through the resistor R12. The resistor R11 and the constant current circuit 12 are coupled to each other at the node N3. The cathode of the diode is connected to the power line 3.

A resistor (third resistor) R13 is connected between the anode of the diode and the bases of the transistors Q3, Q4.

An output circuit 8 includes a resistor R2, a transistor Q6 and a constant current circuit 7. The resistor R2 is connected between the base of the transistor Q6 and the output node N2 of the comparator 11. The transistor Q6 and the constant current circuit 7 are connected in series to each other at a node N4 and interposed between the power lines 2,3. The output circuit 8 acts as a buffer circuit.

When the output node N2 is used as an output terminal of the comparator 11, the bases of the transistors Q1, Q2 can be used as an inverting input terminal and a non-inverting input terminal of the comparator 11, respectively. The reference voltage Vref is applied to the inverting input terminal and an input voltage Vin is applied to the non-inverting input terminal.

The comparator 11 has the first threshold voltage VTL and the second threshold voltage VTH, when the reference voltage Vref is applied to the inverting input terminal.

The output voltage of the output node N2 changes from high level (VF) to low level (VCEsat (Q5)), when the input voltage Vin falls below the first threshold voltage VTL slowly. In contrast, the output voltage of the output node N2 changes from low level to high level, when the input voltage Vin rises above the second threshold voltage VTH slowly.

Operations of the comparator 11 are described in detail below with further reference to FIG. 2 and FIG. 3.

When the input voltage Vin rises above the second threshold voltage VTH, an output voltage of the output node N1 falls to near 0 V so that the transistor Q5 is turned off, as shown in FIG. 1A.

Then, a current $I_1(R12)$ flows from the constant current circuit 12 to the power line 3 through the resistor R12 and the transistor Q11 as the diode. Further, a current $I_1(R11)$ flows from the constant current circuit 12 to the base of the transistor Q6 through the resistor R2. The current $I_1(R11)$ turns on the transistor Q6 so that an output voltage Vout of the node N4 becomes low level (VCEsat (Q6)). The VCEsat (Q6) is a collector-emitter saturation voltage of the transistor Q6.

Because the transistor Q11 is turned on, the forward voltage VF is applied to the collector (base) of the transistor Q11. As a result, the forward voltage VF is applied to both ends of the resistor R13 so that no current flows through the resistor R13.

Thus, in the differential amplification circuit 5, balance of current flowing through the transistors Q1, Q2 is maintained. As shown in FIG. 2, therefore, the first threshold voltage VTL becomes equal to the reference voltage Vref.

In contrast, when the input voltage Vin falls below the first threshold voltage VTL, the output voltage of the output node N1 rises. As shown in FIG. 1B, therefore, the transistor Q5 is turned on so that the output voltage of the output node N2 becomes low level (VCEsat (Q5)). As a result, the transistor Q6 is turned off so that the output voltage Vout of the node N4 becomes high level (approximately the power voltage Vcc).

Then, a current $I_2(R12)$ enters the node N3 from the bases of the transistors Q3, Q4 through the resistors R13, R12. The current $I_2(R12)$ breaks the balance of the current flowing through the transistors Q1, Q2. Thus, the second threshold voltage VTH becomes higher than the reference voltage Vref.

The constant current Ia also enters the node N3 from the constant current circuit 12. A current $I_2(R11)$, which is the sum of the current $I_2(R12)$ and the constant current Ia, flows to the power line 3 through the resistor R11 and the transistor Q5. The current $I_2(R11)$ is given by the following equation;

$$I_2(R11) = \frac{\{(R12 + R13)Ia + VF - VCE_{sat}(Q5)\}}{R11 + R12 + R13}$$

When the current $I_2(R11)$ flows through the resistor R11, the voltage of the node N3 rises. Accordingly, the voltage of the resistor R13 falls so that the current $I_2(R12)$ decreases. Thus, the second threshold voltage VTH becomes slightly higher than the reference voltage Vref.

Resistance values of the resistors R2, R11, R12, and R13 are determined based on the above operations of the comparator 11.

When the input voltage Vin is higher than the second threshold voltage VTH, the base current of the transistor Q11 needs to be large enough to reliably turn on the transistor Q11 in order to keep both ends of the resistor R13 at the forward voltage VF.

Further, the base current of the transistor Q6 needs to be large enough to reliably turn on the transistor Q6.

Therefore, it is impossible to highly reduce only one of the total resistance of the resistor R2 plus the resistor R11 and the resistance of the resistor R12.

In view of the above requirements, it is desirable that the total resistance of the resistor R2 plus the resistor R11 be set almost equal to the resistance of the resistor R12.

In contrast, when the input voltage Vin is lower than the first threshold voltage VTL, there is a need to increase the voltage of the node N3 by using the voltage drop of the resistor R11 in order to reduce the voltage of the resistor R13. However, if the voltage of the node N3 rises above the forward voltage VF, the transistor Q11 is turned on so that no current flows through the resistor R13. As a result, the second threshold voltage VTH becomes also equal to the reference voltage Vref, i.e., the first threshold voltage VTL, so that no hysterisis voltage VHIS can be obtained.

Therefore, the resistor R11 needs to meet the following inequality:

$VCE_{sat}(Q5)+R11 \cdot I_2(R11)<VF$

Figures 2, 3:
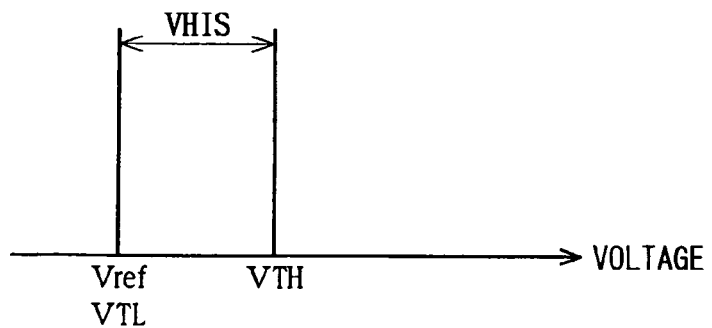
FIG. 2 is a graph illustrating a relation between a reference voltage and threshold voltages of the comparator of FIG. 1A and FIG. 1B.
FIG. 3 is a table showing a simulation result of the comparator of FIG. 1A and FIG. 1B.

FIG. 3 is a table showing a result of a simulation conducted for determining the resistance values to allow the comparator 11 to have a slight hysterisis voltage VHIS of 1 mV. In this simulation, the constant current Ia of the constant current circuit 12 is set to 3 μA, and temperature is set to 27° C. The simulation result indicates that the case 5 is the best setting for the hysterisis voltage VHIS of 1 mV.

As described above, the increase in the resistance of the resistor results in the increase in the IC chip size of the comparator. The resistor generally has 0.024 mm² per 1 MΩ.

Figure 5A:
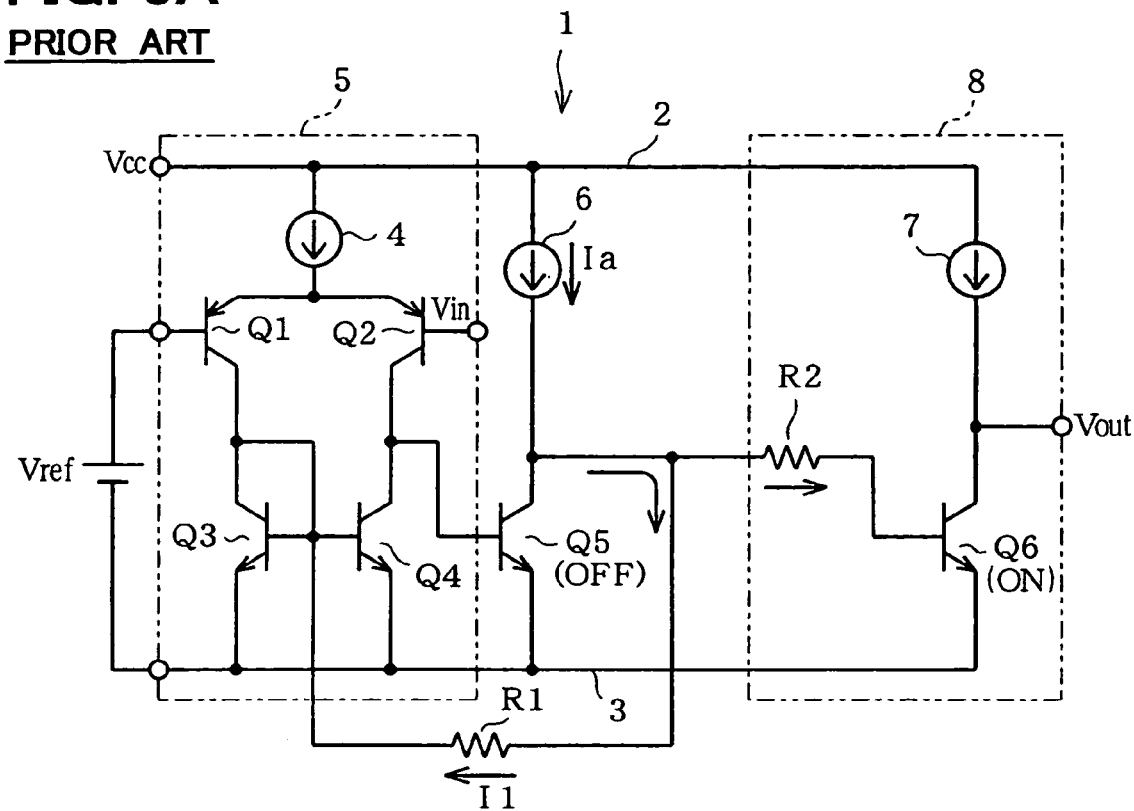
FIGS. 5A and 5B are circuit diagrams of a comparator according to prior art.
Figure 5B:
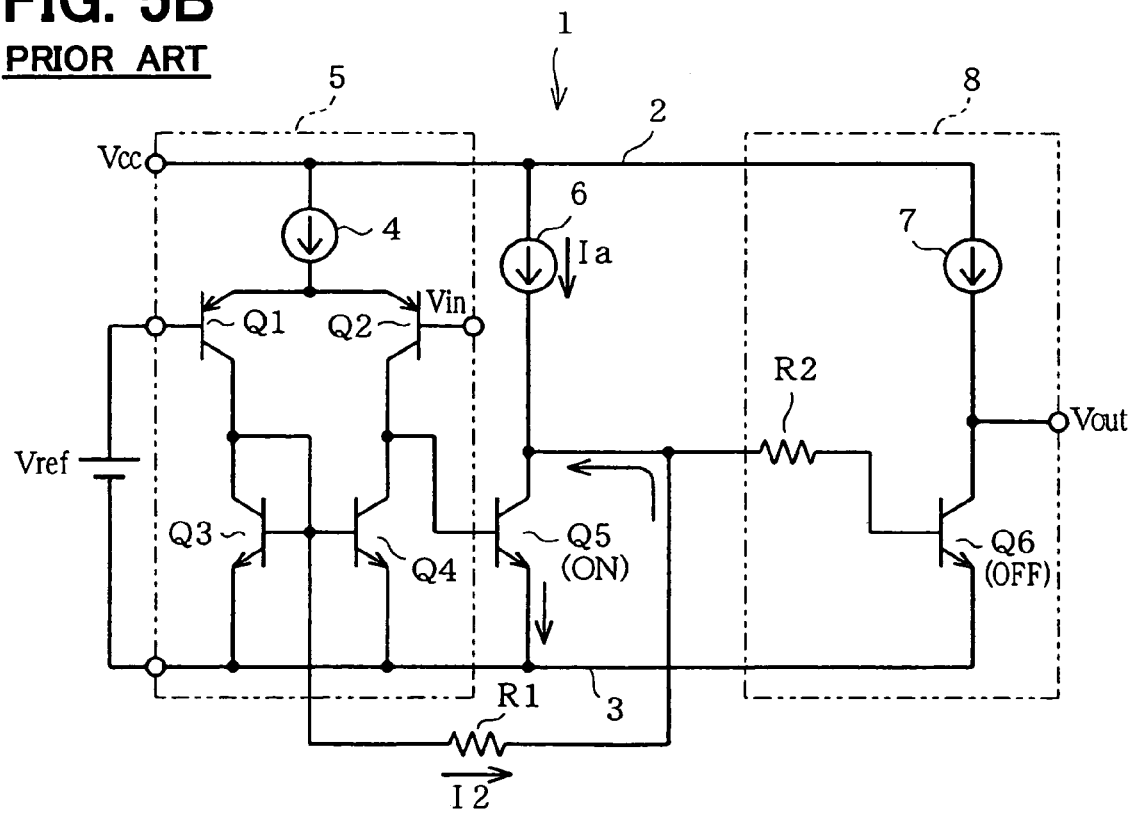

In the prior-art comparator 1 shown in FIG. 5A and FIG. 5B, the resistor R13 needs a resistance of 6.5 MΩ for the hysteresis voltage VHIS of 1 mV.

In contrast, in the comparator 11 having the best setting value of the case 5, the resistor R13 needs a resistance of 500 KΩ for the hysteresis voltage VHIS of 1 mV. Therefore, the IC chip size of the comparator 11 can be much smaller than that of the comparator 1.

As described above, the comparator 11 has the diode (transistor Q11) for clamping the voltage of the resistor R13 to the forward voltage VF.

When the transistor Q5 is in the OFF state, the diode is turned on so that both ends of the resistor R13 are clamped to the forward voltage VF. Therefore, no current flows through the resistor R13 so that the first threshold voltage VTL can be set equal to the reference voltage Vref. In contrast, when the transistor Q5 is in the ON state, the voltage of the resistor R13 becomes close to the forward voltage VF at one end connected to the resistor R12 by increasing the voltage of the resistor R13 at the end. Therefore, the second threshold voltage VTH can be set slightly higher than the reference voltage Vref, even when the resistor R13 has a relatively low resistance.

Thus, the comparator 1 can have the slight hysteresis voltage VHIS without the increase in the size of the resistor R13, i.e., the comparator 11.

The output circuit 8 is interposed between the comparator 11 and a load circuit. Thus, the load circuit is prevented from affecting current condition (bias condition) of the resistors R11-R13 so that the first threshold voltage VTL and the second threshold voltage VTH can be fixed at respective predetermined values.

The constant current circuit 12 provides the constant current Ia to the node N3. Thus, the first threshold voltage VTL and the second threshold voltage VTH can be fixed at the respective predetermined values, even when the power supply voltage Vcc has voltage variations.

The diode for clamping the voltage of the resistor R13 is provided by the transistor Q11 having the base and the emitter coupled to the base. In such an approach, differences in the forward voltage VF between the diode and the transistors Q3, Q4, Q6 may be reduced, even when manufacturing variations or temperature changes occur. Thus, the first threshold voltage VTL and the second threshold voltage VTH can be fixed at the respective predetermined values.

Therefore, the comparator 11 can have the hysteresis voltage VHIS fixed to a predetermined value.

Second Embodiment

Figure 4:
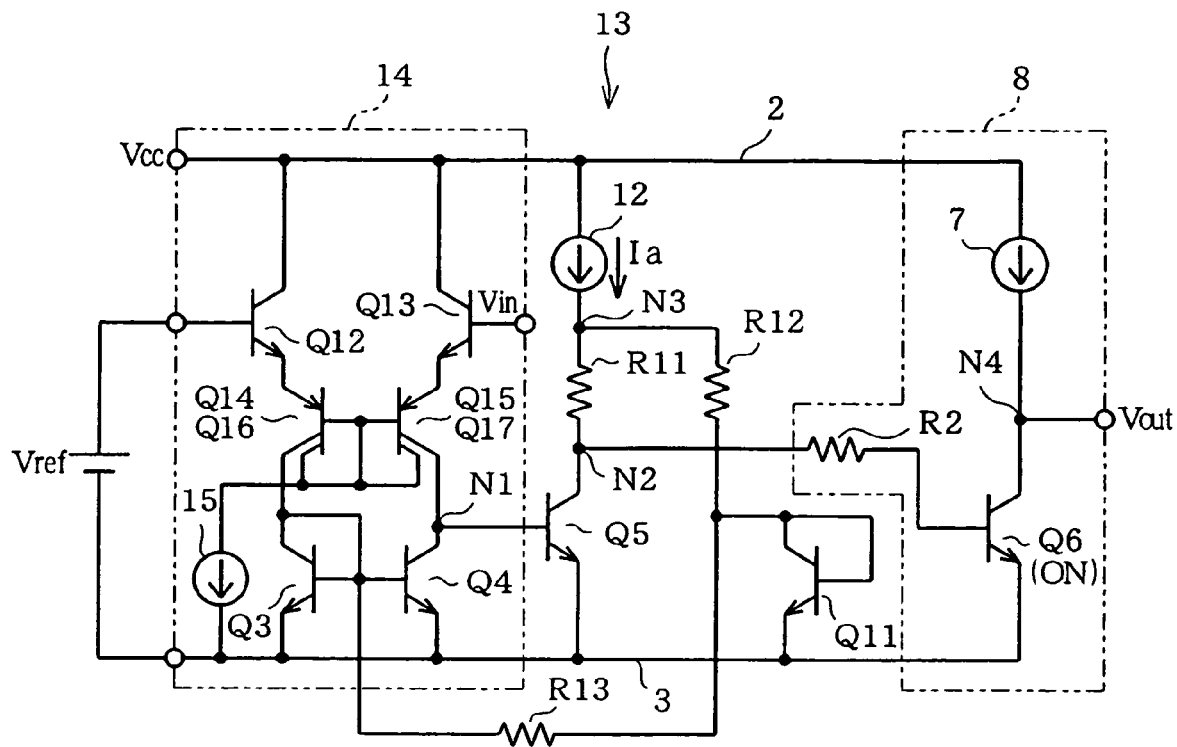
FIG. 4 is a circuit diagram of a comparator according to a second embodiment of the present invention.
Figure 6:
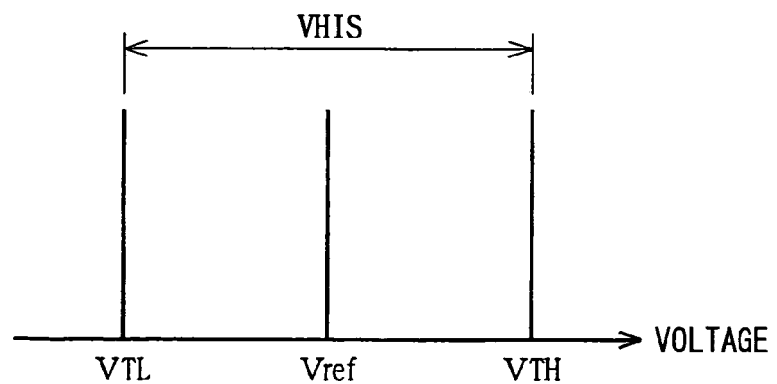
FIG. 6 is a graph illustrating a relation between a reference voltage and threshold voltages of the comparator of FIGS. 5A and 5B.

Reference is made to FIG. 4, which shows a comparator 13 connected to the output circuit 8.

The comparator 13 has a differential amplification circuit 14 having transistors Q12-Q17 in addition to the transistors Q3, Q4. The collectors of the transistors (differential input transistors) Q12, Q13 are connected to the power line 2. The transistor Q14 is connected between the emitter of the transistor Q12 and the collector of the transistor Q3. Likewise, the transistor Q15 is connected between the emitter of the transistor Q13 and the collector of the transistor Q4. The transistor Q14 is coupled to the transistors Q16 to form a current mirror circuit. Likewise, the transistor Q15 is coupled to the transistors Q17 to form another current mirror circuit. A constant current circuit 15 is connected between the collectors (bases) of the transistor Q16, 17 and the power line 3. The comparator 13 operates similar to the comparator 11 so that the comparator 13 can have the slight hysteresis voltage VHIS.

The embodiments described above may be modified in various ways.

For example, in order to clamp the voltage of the resistor R13, various types of voltage clamping circuits may be used instead of the transistor Q11.

Various types of differential amplification circuit may be used instead of the differential amplification circuits 5, 14.

The output circuit 8 may be eliminated, for example, except when the load circuit has low impedance.

The values of the resistors R2, R11-R13 and the constant current Ia shown in FIG. 3 may be adjusted in accordance with a desired hysteresis voltage and desired size of the comparator.

A field-effect transistor may be used instead of the bipolar transistor.

What is claimed is:

1. A comparator comprising:
    a differential amplification circuit having an output node for outputting a voltage, a pair of differential input transistors, and a pair of load transistors having bases coupled to each other, the load transistors being connected between the differential input transistors and a power line;
    an output transistor having a base connected to the output node of the differential amplification circuit and an emitter connected to the power line;
    a current output circuit for outputting an electric current;
    a diode having a cathode connected to the power line to allow the current outputted from the current output circuit to flow into the power line;
    a first resistor connected between the current output circuit and the output transistor;
    a second resistor connected between the current output circuit and an anode of the diode; and
    a third resistor connected between the anode of the diode and the bases of the load transistors.

2. The comparator according to claim 1, wherein the current output circuit is a constant current circuit for outputting a constant current.

3. The comparator according to claim 1, wherein the diode is provided by a transistor having a base and a collector coupled to each other to provide the anode.

4. The comparator according to claim 1, further comprising:
    a buffer circuit connected between the first resistor and a collector of the output transistor.

5. The comparator according to claim 1, wherein the differential amplification circuit further has a current mirror circuit connected between the differential input transistors and the load transistors.

* * * * *